United States Patent
Sato et al.

(10) Patent No.: US 8,242,532 B2
(45) Date of Patent: Aug. 14, 2012

(54) SEMICONDUCTOR LIGHT-EMITTING DEVICE

(75) Inventors: Taisuke Sato, Kanagawa (JP); Toshiyuki Oka, Kanagawa (JP); Koichi Tachibana, Kanagawa (JP); Shinya Nunoue, Chiba (JP); Kazufumi Shiozawa, Kanagawa (JP); Takayoshi Fujii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/873,753

(22) Filed: Sep. 1, 2010

(65) Prior Publication Data

US 2011/0215370 A1 Sep. 8, 2011

(30) Foreign Application Priority Data

Mar. 8, 2010 (JP) .................................. 2010-051040

(51) Int. Cl.
  *H01L 33/26* (2010.01)
(52) U.S. Cl. ..... 257/103; 257/79; 257/98; 257/E33.025; 257/E33.074
(58) Field of Classification Search .................. 257/76, 257/79, 98, 103, E33.023, E33.025, E33.074
See application file for complete search history.

(56) References Cited

U.S. PATENT DOCUMENTS

| 2005/0230699 A1 | 10/2005 | Wu et al. |
| 2006/0145170 A1 | 7/2006 | Cho |
| 2007/0069222 A1 * | 3/2007 | Ko et al. ......................... 257/86 |
| 2010/0117056 A1 * | 5/2010 | Nagai ............................. 257/13 |
| 2012/0012856 A1 * | 1/2012 | Chen et al. ..................... 257/76 |

FOREIGN PATENT DOCUMENTS

| JP | 2002-368261 | 12/2002 |
| JP | 2006-191103 | 7/2006 |
| JP | 2008-141015 | 6/2008 |
| JP | 2009-260316 | 11/2009 |

OTHER PUBLICATIONS

U.S. Appl. No. 13/208,658, filed Aug. 12, 2011, Ono, et al.
Office Action issued Feb. 7, 2012, in Japanese Patent Application No. 2010-051040, filed Mar. 8, 2010 (with English-language Translation), 6 pages.
Office Action issued May 15, 2012 in Japanese Application No. 2010-051040 filed Mar. 8, 2010 (w/English translation).

\* cited by examiner

*Primary Examiner* — Minh-Loan T Tran
*Assistant Examiner* — Fazli Erdem
(74) *Attorney, Agent, or Firm* — Oblon, Spivak, McClelland, Maier & Neustadt, L.L.P.

(57) ABSTRACT

According to one embodiment, a semiconductor light-emitting device having high light extraction efficiency is provided. The semiconductor light-emitting device includes a light transmissive substrate; a nitride semiconductor layer of a first conduction type formed on or above a top face side of the light transmissive substrate; an active layer made of nitride semiconductor formed on a top face of the nitride semiconductor layer of the first conduction type; a nitride semiconductor layer of a second conduction type formed on a top face of the active layer; a dielectric layer formed on a bottom face of the light transmissive substrate and having a refractive index lower than that of the light transmissive substrate; and a metal layer formed on a bottom face of the dielectric layer. And an interface between the light transmissive substrate and the dielectric layer is a uneven face, and an interface between the dielectric layer and the metal layer is a flat face.

6 Claims, 10 Drawing Sheets

SEMICONDUCTOR LIGHT-EMITTING DEVICE

CROSS-REFERENCE TO RELATED APPLICATION

This application is based upon and claims the benefit of priority from Japanese Patent Applications No. 2010-051040, filed on Mar. 8, 2010, the entire contents of which are incorporated herein by reference.

FIELD

Embodiments described herein relate generally to a semiconductor light-emitting device.

BACKGROUND

In recent years, research and development on light emitting diodes (LEDs) of blue and green made of nitride semiconductor such as GaN have been promoted. In the research and development of an LED, improvement in light extraction efficiency is a major issue.

For example, a semiconductor light-emitting device directed to improve light extraction efficiency by forming unevenness or roughness on the surface of a metal layer provided on a backside of a permeable substrate is proposed. And for another example, a semiconductor light-emitting device directed to improve the light extraction efficiency by forming unevenness on a backside of a permeable substrate is also proposed.

DETAILED DESCRIPTION

According to one embodiment, a semiconductor light-emitting device having high light extraction efficiency is provided. The semiconductor light-emitting device includes a light transmissive substrate; a nitride semiconductor layer of a first conduction type formed on or above a top face of the light transmissive substrate; an active layer made of nitride semiconductor formed on a top face of the nitride semiconductor layer of the first conduction type; a nitride semiconductor layer of a second conduction type formed on a top face of the active layer; a dielectric layer formed on a bottom face of the light transmissive substrate and having a refractive index lower than that of the light transmissive substrate; and a metal layer formed on a bottom face of the dielectric layer. And an interface between the light transmissive substrate and the dielectric layer is a uneven face, and an interface between the dielectric layer and the metal layer is a flat face. Embodiments will be described below with reference to the drawings. In the following description of the drawings, the same or likewise reference numerals are designated to the same or likewise components.

In the specification, for convenience, the direction on a nitride semiconductor layer side using a light transmissive substrate as a reference will be called "up" or "upper side", and the surface on the upper side of each of the light transmissive substrate, a semiconductor layer, and the like will be called a "top face". The opposite direction will be called "down" or "down side" and the surface on the lower side of the substrate, the semiconductor layer, and the like will be called an "bottom face". Therefore, "up" and "down" do not always coincide up and down in the vertical direction. The "refractive index" in the specification denotes a refractive index with respect to light having a wavelength generated from the active layer in the semiconductor light-emitting device.

The semiconductor light-emitting device of the embodiment has a light transmissive substrate, a nitride semiconductor layer of a first conduction type formed on or above the top face of the light transmissive substrate, an active layer made of nitride semiconductor formed on the top face of the nitride semiconductor layer of the first conduction type, a nitride semiconductor layer of a second conduction type formed on the top face of the active layer, a dielectric layer formed on the bottom face of the light transmissive substrate and having a refractive index lower than that of the light transmissive substrate, and a metal layer formed on the bottom face of the dielectric layer. An interface between the light transmissive substrate and the dielectric layer is an uneven or rough face, and an interface between the dielectric layer and the metal layer is a flat or smooth face.

With the configuration, the semiconductor light-emitting device of the embodiment makes light emitted from the active layer toward the transmissive substrate side efficiently reflected and diffused by the uneven face of the interface between the transmissive substrate and the dielectric layer and the flat face of the interface between the dielectric layer and the metal layer, and emits the resultant light to the outside of the device. Therefore, the semiconductor light-emitting device having high light extraction efficiency is realized.

Figure 1:
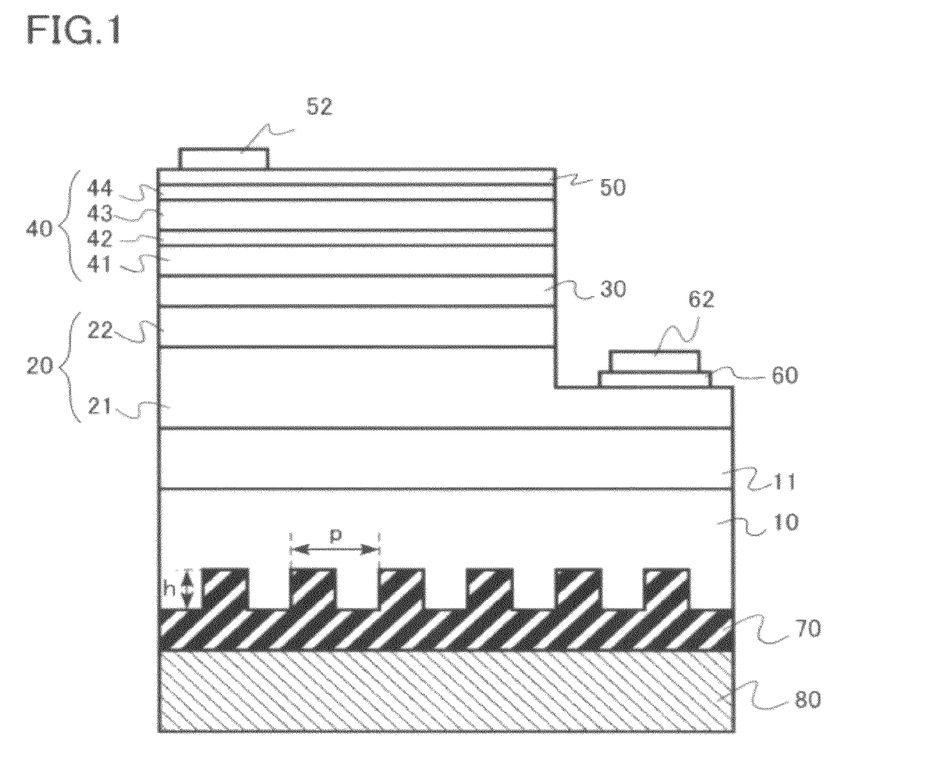
FIG. 1 is a schematic cross section of a semiconductor light-emitting device of an embodiment.

FIG. 1 is a schematic cross section of a semiconductor light-emitting device of the embodiment. A light emitting diode (LED) formed of GaN-based semiconductor of the FU (Face Up) type will be described as an example.

As shown in FIG. 1, in the semiconductor light-emitting device of the embodiment, for example, a buffer layer 11 is formed on the top face of a light transmissive substrate 10 made of sapphire. The light transmissive substrate 10 is a material transmitting light having a wavelength generated by the light emitting device of the embodiment.

On the buffer layer 11, an n-type GaN layer 21 and an n-type GaN guide layer 22 are formed. The n-type GaN layer 21 and the n-type GaN guide layer 22 are included in an n-type semiconductor layer 20.

An active layer 30 as a light emitting part is formed on the top face of the n-type GaN guide layer 22. On the active layer 30, a p-type GaN first guide layer 41, a p-type AlGaN layer 42 as an electron overflow preventing layer, a p-type GaN second guide layer 43, and a p-type GaN contact layer 44 are formed in this order. The p-type GaN first guide layer 41, the p-type AlGaN layer 42, the p-type GaN second guide layer 43, and the p-type GaN contact layer 44 are included in a p-type semiconductor layer 40.

Further, on the p-type GaN contact layer 44 as the uppermost part of the p-type semiconductor layer 40, a p-type electrode 50 made of, for example, ITO (Indium Tin Oxide) and a p-type pad electrode 52 made of, for example, Au are formed. On the n-type GaN layer 21, an n-type electrode 60 made of, for example, titanium/platinum/gold (Ti/Pt/Au) and an n-type pad electrode 62 made of, for example, Au are formed.

The active layer 30 as a light emitting part has, for example, an MQW (Multiple Quantum) structure formed of InGaN-based semiconductor. A stack structure of a barrier layer, a quantum well layer, and a barrier layer is, for example, repeatedly provided a plurality of times.

On the bottom face of the light transmitting substrate 10, that is, the substrate backside on the side opposite to the face on which the active layer 30 is formed, a dielectric layer 70 made of a material having a refractive index lower than that of the light transmissive substrate 10 and transmitting light having a wavelength generated by the light emitting device is formed. Further, a metal layer 80 is formed on the bottom face of the dielectric layer 70. The dielectric layer 70 is made of, for example, $SiO_2$. The refractive index of sapphire is about 1.8, and the refractive index of $SiO_2$ is about 1.46. The metal layer 80 is made of, for example, Ag.

The interface between the light transmissive substrate 10 and the dielectric layer 70 is an uneven or rough face, and the interface between the dielectric layer 70 and the metal layer 80 is a flat or smooth face. The uneven face denotes a face having clear unevenness or roughness as compared with the top face of the light transmissive substrate 10. For example, when an intermediate value (median) of five maximum unevenness height values (the maximum value of distance "h" in FIG. 1) obtained in the case of observing the section of an arbitrary interface in five places in 30 μm by a scanning electron microscope (SEM) or a transmission electron microscope (TEM) is 0.05 μm or larger, the surface is determined as an uneven face.

The flat face denotes a face having flatness which is substantially equal to that of the top face of the light transmissive substrate 10. For example, when an intermediate value (median) of five maximum unevenness height values (the maximum value of distance "h" in FIG. 1) obtained in the case of observing the section of an arbitrary interface in five places in 30 μm by a scanning electron microscope (SEM) or a transmission electron microscope (TEM) is less than 0.05 μm, the surface is determined as a flat face.

Generally, in an LED of the FU (Face Up) type, light generated by the active layer 30 repeats multiple reflection in the device and is emitted to the outside of the device. Consequently, to improve the light extraction efficiency of the LED, it is necessary to efficiently emit the light which goes from the active layer 30 toward the light transmissive substrate 10 side to the outside of the device.

Figure 2:
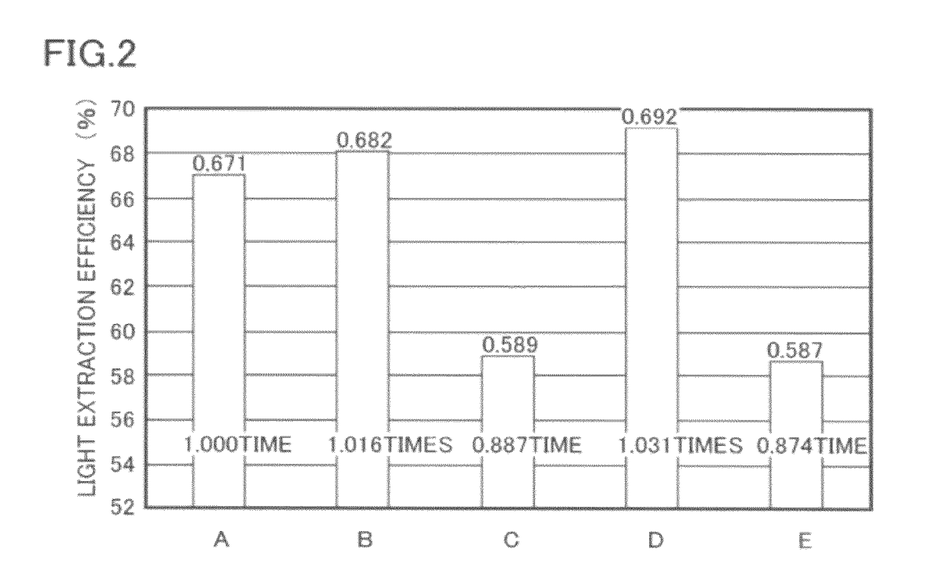
FIG. 2 is a diagram showing a simulation result of the relation between light extraction efficiency of the semiconductor light-emitting device and a structure of a substrate backside.
Figure 3A:
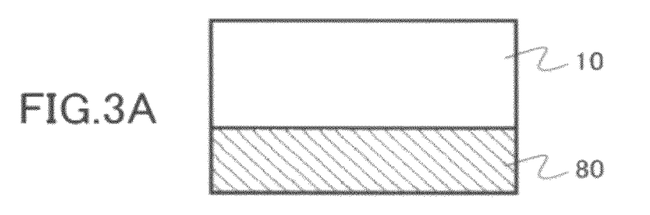
FIGS. 3A to 3E are schematic cross sections showing the structure of a substrate backside used for the simulation of FIG. 2.
Figure 3B:
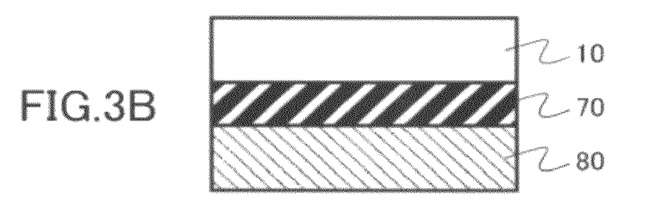
Figure 3C:
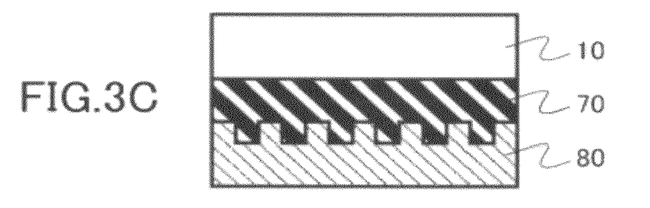
Figure 3D:
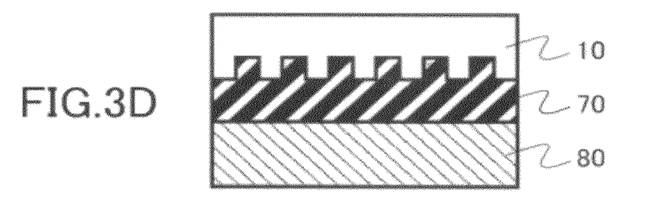
Figure 3E:
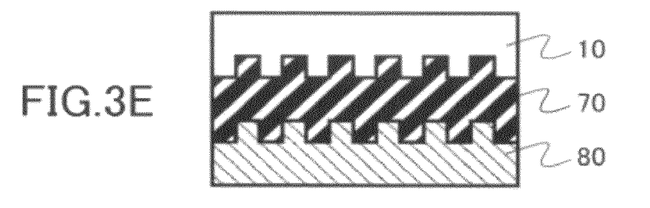
Figure 4:
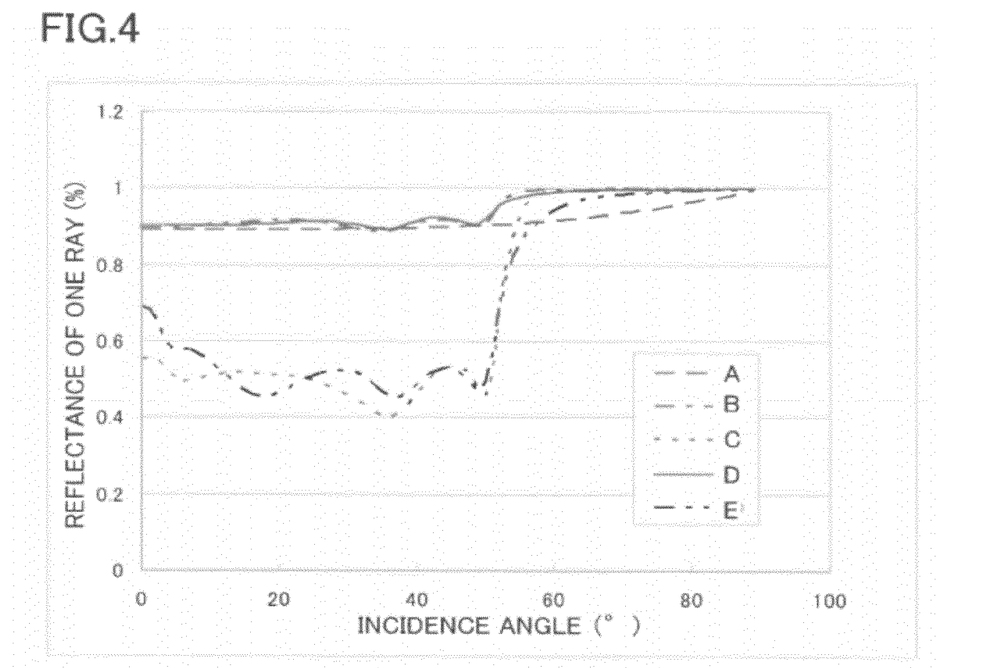
FIG. 4 is a diagram showing a simulation result of the reflectance of the backside in the structure of FIG. 3.
Figure 5A:
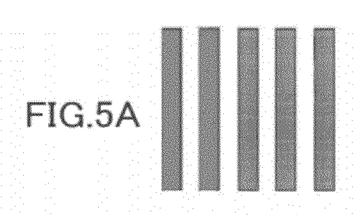
FIGS. 5A to 5H are plan views showing concrete examples of the shapes of the unevenness in an uneven face.
Figure 5B:
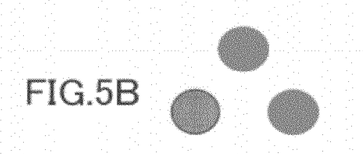
Figure 5C:
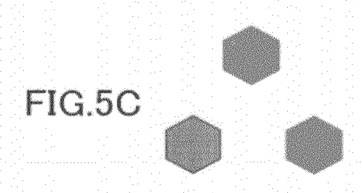
Figure 5D:
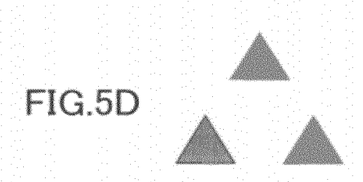
Figure 5E:
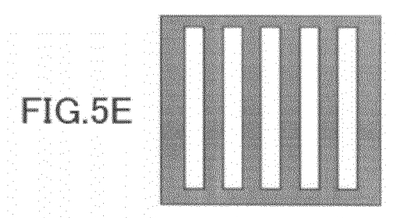
Figure 5F:
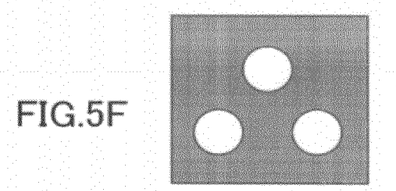
Figure 5G:
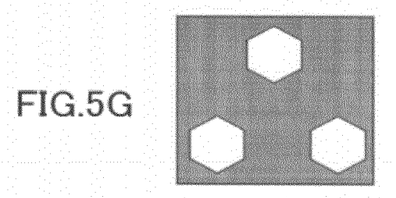
Figure 5H:
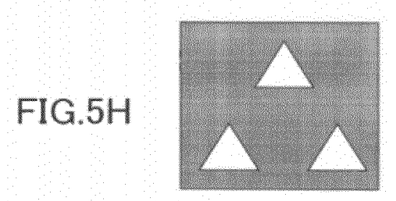

FIG. 2 is a diagram showing a simulation result of the relation between the light extraction efficiency of the semiconductor light-emitting device and the structure of the substrate backside. FIGS. 3A to 3E are schematic cross sections showing the structure of a substrate backside used for the simulation of FIG. 2. A to E in FIG. 2 correspond to the structures of the substrate backside shown in FIGS. 3A to 3E, respectively. A to E in FIG. 4 indicate the reflectance characteristic of the backside in the structures. FIG. 4 shows the reflectance characteristic in the case where a ray of light (1 pass) at a predetermined angle is incident on each of the structures.

In the simulation of FIG. 2, the light transmissive substrate 10 is made of sapphire, the dielectric layer 70 has a thickness of 400 nm and made of $SiO_2$, and the metal layer 80 is made of Ag. The height of the unevenness indicated as the distance "h" in FIG. 1 is 0.1 μm, and the unevenness pitch shown as a distance "p" in FIG. 1 is 0.4 μm. The wavelength of light is 450 nm.

In the device having the reflectance characteristics of FIG. 4, the ratio of light emitted to the outside of the device of light emitted from the active layer is obtained by three-dimensional ray-trace simulation and is used as the light extraction efficiency. The diagram of FIG. 2 shows the values of the light extraction efficiency of the structures A to E and the multiples of the light extraction efficiency of the structures A to E when the light extraction efficiency of the structure A is set as 1.

In the structure A, the backside of the light transmissive substrate 10 is only the metal layer 80, and the interface of the light transmissive substrate and the metal layer is a flat face. In the structure B, the backside of the light transmissive substrate 10 has a stack structure of the dielectric layer 70 and the metal layer 80 and both of the interface between the light transmissive substrate and the dielectric layer and the interface between the dielectric layer and the metal layer are flat faces. The structure C is also a stack structure, the interface between the light transmissive substrate and the dielectric layer is a flat face, and the interface between the dielectric layer and the metal layer is an uneven face. The structure D is also a stack structure and corresponds to the structure of the embodiment. The interface between the light transmissive substrate and the dielectric layer is an uneven face, and the interface between the dielectric and the metal layer is a flat face. The structure E is also a stack structure, and both of the interface between the light transmissive substrate and the dielectric layer and the interface between the dielectric layer and the metal layer are uneven faces.

As obvious from FIG. 2, the light extraction efficiency in the structure D corresponding to the embodiment is the highest. In the semiconductor light-emitting device of the embodiment, by providing the dielectric layer 70 having a refractive index lower than that of the light transmissive substrate 10, light incident on the interface between the light transmissive substrate 10 and the dielectric layer 70 at an angle equal to or larger than the critical angle total-reflects. Since no energy loss in reflection occurs in the totally reflecting light, it contributes to improvement in the light extraction efficiency.

In comparison with the structure B, it is understood that when the interface between the light transmissive substrate and the dielectric layer is an uneven face, the light extraction efficiency improves. By making the interface between the light transmissive substrate and the dielectric layer an uneven face, light is not regularly reflected but is scattered. By the scattering, the light extraction efficiency improves. In particular, in the case of the device where absorption of the n-type semiconductor layer 20, the active layer 30, the p-type semiconductor layer 40, the p-type electrode 50, and the like formed on the light transmissive substrate 10 is large, the scattering on the backside is valid for a reason that propagation in the lateral direction in the light transmissive substrate 10 which is not influenced by the absorbers becomes large.

In the structures C and E, the light extraction efficiency is extremely low. The reason is considered that, as obvious also from the result of FIG. 4, in the uneven face of the metal layer, the surface plasmon is excited by the incident light, and reflection light is absorbed.

As described above, according to the embodiment, the semiconductor light-emitting device having high light extraction efficiency is realized.

FIGS. 5A to 5H are plan views showing concrete examples of the shapes of the unevenness in the uneven face. The hatched parts in the drawings correspond to unevenness when viewed from the light transmissive substrate side. As shown in FIGS. 5A to 5H, shapes such as the stripe shape, circular shape, polygonal shapes such as triangular shape and hexagonal shape, and the like can be applied. In other word, the uneven face may have a stripe pattern, a circular pattern, or a polygonal pattern. The invention is not limited to the shapes in FIGS. 5A to 5H, but any shapes may be employed as long as unevenness are formed. The shape and layout are not limited to regular ones but may be random ones. Although each of the unevenness has perpendicular faces in FIG. 1, it may have a tapered shape or a curved shape.

Desirably, the height of a unevenness on the uneven face is 0.05 μm or more to 5 μm or less, and pitch of unevenness is 0.1 μm or more to 10 μm or less. More desirably, the height of unevenness is 0.1 μm or more to 2 μm or less, and pitch of unevenness is 0.3 μm or more to 1 μm or less.

When the height of the unevenness or the unevenness pitch becomes smaller or larger than the range, the effect of light scattering and reflection by the unevenness may decrease.

The height of the unevenness and the unevenness pitch can be evaluated by section observation with a scanning electron microscope (SEM) or a transmission electron microscope (TEM). In the case of actually evaluating the height of the unevenness or the unevenness pitch, it is necessary to remove an abnormal value which is obviously different from the distribution.

Next, a method of manufacturing the semiconductor light-emitting device of the embodiment will be described. FIGS. 6 to 10 are process cross sections showing a method of manufacturing a semiconductor light-emitting device of the embodiment.

Figure 6:
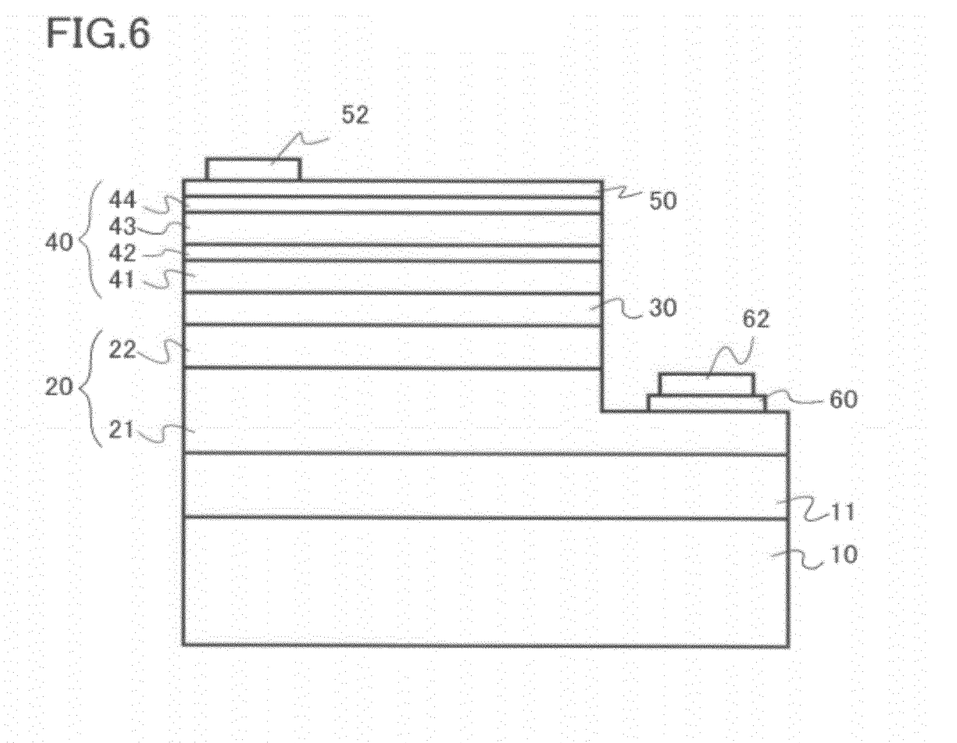
FIG. 6 is a process cross section showing a method of manufacturing the semiconductor light-emitting device of the embodiment.

As shown in FIG. 6, first, as a wafer for forming a semiconductor light-emitting device, for example, the light transmissive substrate 10 made of sapphire is prepared. On the light transmissive substrate 10, after the buffer layer 11 is formed and, the n-type GaN layer 21 doped with n-type impurity is crystal-grown. For the crystal growth, for example, metal organic chemical vapor deposition (MOCVD) is used. The crystal growth may be also performed by molecular beam epitaxy (MBE).

As the n-type impurity, various elements such as Si, Ge, and Sn can be used. In the embodiment, Si is used. The doping amount of Si may be about $2 \times 10^{18}$ cm$^{-3}$.

Next, on the n-type GaN layer 21, the n-type guide layer 22 made of GaN doped with the n-type impurity of about $1 \times 10^{18}$ cm$^{-3}$ and having a thickness of about 0.1 μm is crystal-grown. The growth temperature at the time of growing the n-type GaN layer 21 and the n-type guide layer 22 is 1,000 to 1,100° C. For the n-type guide layer 22, not GaN, but $In_{0.01}Ga_{0.99}N$ having a thickness of about 0.1 μm may be used. The growth temperature in the case of using $In_{0.01}Ga_{0.99}N$ is 700 to 800° C.

Next, the active layer 30 having a multiple quantum well (MQW) structure obtained by stacking a quantum well layer made of undoped $In_{0.2}Ga_{0.8}N$ and having a thickness of about 2.5 nm, which is sandwiched by barrier layers made of $In_{0.02}Ga_{0.98}N$ each having a thickness of about 12.5 nm is formed on the n-type guide layer 22. The growth temperature in this case is 700 to 800° C. The wavelength of photoluminescence at room temperature is designed to 450 nm.

On the active layer 30, the p-type first guide layer 41 made of GaN is grown. The thickness may be about 30 nm. The temperature of growing GaN is 1,000 to 1,100° C. As p-type impurity, various elements such as Mg and Zn can be used. In this case, Mg is used. The doping amount of Mg is about $4 \times 10^{18}$ cm$^{-3}$. As the p-type first guide layer 41, $In_{0.01}Ga_{0.99}N$ having a thickness of about 30 nm may be used. The growth temperature in the case of using $In_{0.01}Ga_{0.99}N$ is 700 to 800° C.

Next, on the p-type first guide layer 41, $Ga_{0.8}Al_{0.2}N$ having a thickness of about 10 nm doped with p-type impurity is grown as the electron overflow preventing layer 42. The doping amount of Mg may be about $4 \times 10^{18}$ cm$^{-3}$. The growth temperature of $Ga_{0.8}Al_{0.2}N$ is 1,000 to 1,100° C.

Subsequently, on the electron overflow preventing layer 42, the p-type GaN second guide layer 43 with which Mg of about $1 \times 10^{19}$ cm$^{-3}$ is doped is grown. The thickness may be about 50 nm. The temperature of growing GaN is 1,000 to 1,100° C.

As the final crystal growth, the p-type GaN contact layer 44 having a thickness of about 60 nm and with which Mg of about $1 \times 10^{20}$ cm$^{-3}$ is doped is grown.

On the p-type GaN contact layer 44, the p-type electrode 50 made of, for example, indium tin oxide (ITO) is formed. The thickness is, for example, 50 nm or more to 300 nm or less, preferably, 100 nm or more to 250 nm or less. When ITO is too thin, the sheet resistance is too high, and current does not expand. When ITO is too thick, although the sheet resistance is low, the light extraction efficiency is low due to light absorption. In this case, the thickness of ITO is set to 170 nm.

After formation of the p-type electrode 50, dry etching is partly performed to make the n-type GaN layer 21 exposed, and the n-type electrode 60 is formed. The n-type electrode 60 is formed by, for example, a composite film of titanium-platinum-gold (Ti/Pt/Au). For example, the Ti film has a thickness of about 0.05 μm, the Pt film has a thickness of about 0.05 μm, and the Au film has a thickness of about 0.2 μm.

The p-type pad electrode 52 is formed on the p-type electrode 50, and the n-type pad electrode 62 is formed on the n-type electrode 60. Each of the pad electrodes 52 and 62 is formed by, for example, an Au film having a thickness of about 1.0 μm.

After forming the semiconductor light-emitting device on the light transmissive substrate 10 as described above, the wafer of the light transmissive substrate 10 is ground and polished from a bottom face thereof to a thickness of, for example, about 200 μm.

Figure 7:
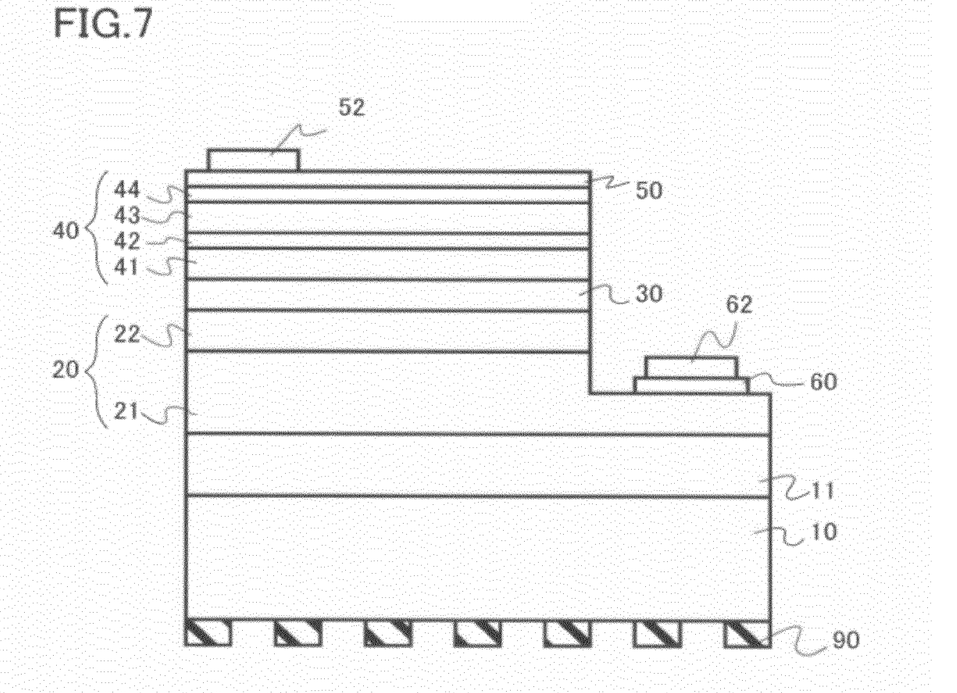
FIG. 7 is a process cross section showing a method of manufacturing the semiconductor light-emitting device of the embodiment.
Figure 8:
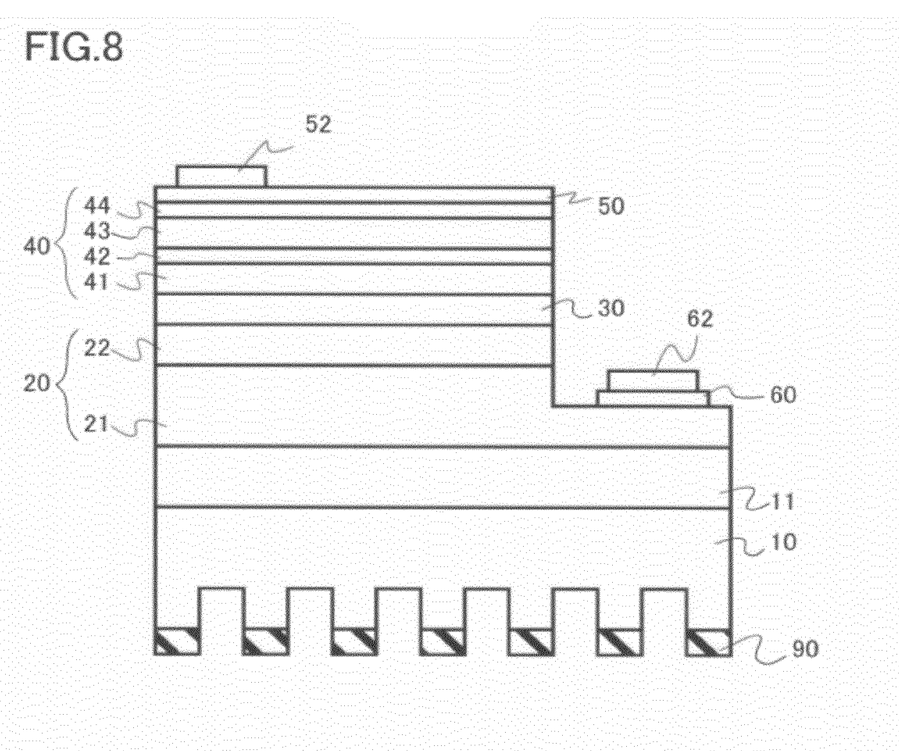
FIG. 8 is a process cross section showing a method of manufacturing the semiconductor light-emitting device of the embodiment.

Next, as shown in FIG. 7, to form recesses in the light transmissive substrate 10, a resist mask 90 is formed by the lithography method. Subsequently, as shown in FIG. 8, for example, by reactive ion etching (RIE), the light transmissive substrate 10 is etched to form recesses.

Figure 9:
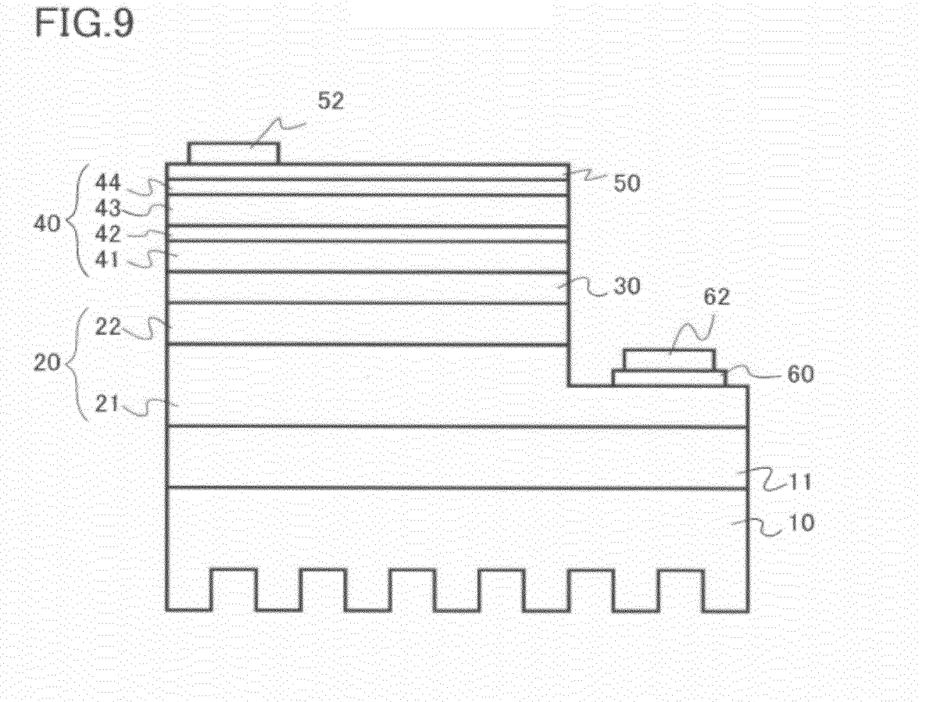
FIG. 9 is a process cross section showing a method of manufacturing the semiconductor light-emitting device of the embodiment.
Figure 10:
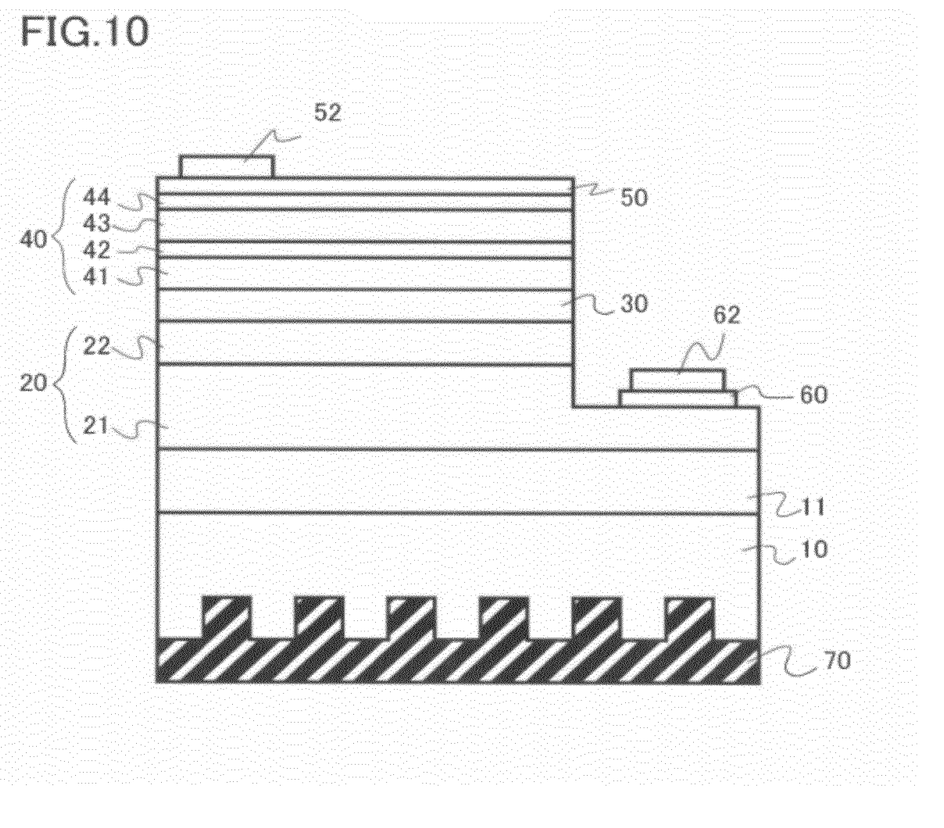
FIG. 10 is a process cross section showing a method of manufacturing the semiconductor light-emitting device of the embodiment.

As shown in FIG. 9, the resist mask 90 is removed. Next, as shown in FIG. 10, for example, the dielectric layer 70 made of $SiO_2$ is deposited by, for example, CVD and the surface is planarized by, for example, chemical mechanical polishing (CMP). After that, for example, an Ag film is formed by the evaporation method as the metal layer 80. As a result, the semiconductor light-emitting device of the embodiment shown in FIG. 1 can be manufactured.

While certain embodiments have been described, these embodiments have been presented by way of example only, and are not intended to limit the scope of the inventions. Indeed, the semiconductor light-emitting device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The case of using sapphire for the light transmissive substrate 10 has been described as an example. In particular, in the case of growing GaN semiconductor, it is desirable to use a sapphire substrate which has excellent heat resistance and corrosion resistance and is relatively cheap. However, the invention is not limited to the sapphire substrate. Various light transmissive substrates of GaN, SiC, Si, GaAs, and the like can be used.

The case of using $SiO_2$ for the dielectric layer has been described as an example. For the dielectric layer, SiOn, SiN, $Al_2O_3$, $TiO_2$, ZnO, $ZrO_2$, $HfO_2$, MgO, $In_2O_3$, or the like can be also applied. Not only an inorganic material but also an organic material such as resin may be used for the dielectric layer.

The case of using Ag for the metal layer has been described as an example. From the viewpoint that the reflectance of light having short wavelength is high, it is desirable to apply Ag. From the viewpoint of durability and corrosion resistance, it is desirable to use, for example, Al (aluminum). The metal layer can be made of at least one metal element selected from Au (gold), Cu (copper), Pt (platinum), Pd (palladium), Rh (rhodium), Ta (tantalum), Ni (nickel), Co (cobalt), Cr (chromium), and Ti (titanium).

Although the case of forming the recesses in the light transmissive substrate by lithography or RIE has been described as an example, another process such as rough grinding and polishing, wet etching having plane orientation dependence on the light transmissive substrate, or the like may be used.

For example, the dielectric layer may have a stack structure. When the dielectric layer in a part which is in contact with the light transmissive substrate has a refractive index lower than that of the light transmissive substrate, the total reflection condition is satisfied. Consequently, a stack structure in which a dielectric film in an uppermost part of a dielectric layer in the stack structure has a refractive index lower than that of the light transmissive substrate, and a dielectric film having a refractive index higher than that of the light transmissive substrate is provided below the dielectric layer may be also employed.

What is claimed is:

1. A semiconductor light-emitting device comprising:
   a light transmissive substrate;
   a nitride semiconductor layer of a first conduction type formed on or above a top face of the light transmissive substrate;
   an active layer made of nitride semiconductor formed on a top face of the nitride semiconductor layer;
   a nitride semiconductor layer of a second conduction type formed on a top face of the active layer;
   a dielectric layer formed on a bottom face of the light transmissive substrate and having a refractive index lower than that of the light transmissive substrate; and
   a metal layer formed on a bottom face of the dielectric layer,
   wherein an interface between the light transmissive substrate and the dielectric layer is an uneven face, and
   an interface between the dielectric layer and the metal layer is a flat face.

2. The device according to claim 1, wherein height of unevenness in the uneven face is 0.05 µm or more to 5 µm or less, and pitch of unevenness in the uneven face is 0.1 µm or more to 10 µm or less.

3. The device according to claim 1, wherein the light transmissive substrate is made of sapphire.

4. The device according to claim 1, wherein the dielectric layer is made of $SiO_2$, SiON, SiN, $Al_2O_3$, $TiO_2$, ZnO, $ZrO_2$, $HfO_2$, MgO, or $In_2O_3$.

5. The device according to claim 1, wherein the metal layer is made of at least one metal element selected from Ag, Al, Au, Cu, Pt, Pd, Rh, Ta, Ni, Co, Cr, and Ti.

6. The device according to claim 1, wherein the uneven face has a stripe pattern, a circular pattern, or a polygonal pattern.

* * * * *